(12) United States Patent
Kwon et al.

(10) Patent No.: US 9,502,604 B2
(45) Date of Patent: *Nov. 22, 2016

(54) BACKPLANE FOR FLAT PANEL DISPLAY APPARATUS, METHOD OF MANUFACTURING THE BACKPLANE, AND ORGANIC LIGHT EMITTING DISPLAY APPARATUS INCLUDING THE BACKPLANE

(71) Applicant: Samsung Display Co., Ltd., Yongin, Gyeonggi-do (KR)

(72) Inventors: Do-Hyun Kwon, Yongin (KR); Il-Jung Lee, Yongin (KR); Choong-Youl Im, Yongin (KR); Moo-Soon Ko, Yongin (KR); Ju-Won Yoon, Yongin (KR); Min-Woo Woo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/810,179

(22) Filed: Jul. 27, 2015

(65) Prior Publication Data
US 2015/0357393 A1    Dec. 10, 2015

Related U.S. Application Data

(63) Continuation of application No. 13/705,152, filed on Dec. 4, 2012, now Pat. No. 9,093,572.

(30) Foreign Application Priority Data

Apr. 12, 2012    (KR) ........................ 10-2012-0038168

(51) Int. Cl.
*H01L 29/66*    (2006.01)
*H01L 33/00*    (2010.01)
(Continued)

(52) U.S. Cl.
CPC ....... *H01L 33/0041* (2013.01); *H01L 27/1225* (2013.01); *H01L 27/1255* (2013.01);
(Continued)

(58) Field of Classification Search
CPC .................... H01L 29/78633; H01L 29/7869; H01L 27/1255; H01L 27/1225; H01L 27/3265
USPC ............ 257/E21.413, E29.29, 340; 438/155
See application file for complete search history.

(56) References Cited

U.S. PATENT DOCUMENTS 6,762,564 B2    7/2004    Noguchi et al.
7,642,587 B2    1/2010    Kim
(Continued)

FOREIGN PATENT DOCUMENTS

JP    2003-330387 A    11/2003
KR    10-2003-0081991 A    10/2003
(Continued)

*Primary Examiner* — Kimberly Rizkallah
*Assistant Examiner* — Maria Ligai
(74) *Attorney, Agent, or Firm* — Lewis Roca Rothgerber Christie LLP

(57) ABSTRACT

A backplane for a flat panel display apparatus, includes: a thin film transistor (TFT) on a substrate and including an active layer, a gate electrode, a source electrode, and a drain electrode; a light-blocking layer between the substrate and the TFT; a first insulating layer between the light-blocking layer and the TFT; a capacitor including a first electrode on the same plane as the light-blocking layer, and a second electrode on the first electrode, wherein the first insulating layer is between the first electrode and the second electrode; and a pixel electrode on the same plane as the light-blocking layer.

20 Claims, 7 Drawing Sheets

(51) Int. Cl.
    *H01L 51/52*     (2006.01)
    *H01L 29/786*     (2006.01)
    *H01L 29/24*     (2006.01)
    *H01L 27/32*     (2006.01)
    *H01L 27/12*     (2006.01)

(52) U.S. Cl.
    CPC ....... *H01L27/3258* (2013.01); *H01L 27/3262* (2013.01); *H01L 27/3265* (2013.01); *H01L 27/3272* (2013.01); *H01L 29/24* (2013.01); *H01L 29/7869* (2013.01); *H01L 29/78633* (2013.01); *H01L 51/52* (2013.01)

(56) References Cited

U.S. PATENT DOCUMENTS

| | | | |
|---|---|---|---|
| 8,022,898 | B2 | 9/2011 | Kang et al. |
| 2002/0056862 | A1* | 5/2002 | Miki .................. H01L 28/60 257/295 |
| 2003/0193284 | A1* | 10/2003 | Park .................. H01L 27/3244 313/504 |
| 2004/0119399 | A1 | 6/2004 | Nagayama |
| 2007/0077672 | A1* | 4/2007 | Kang .................. G02F 1/13454 438/30 |
| 2007/0102713 | A1 | 5/2007 | Yamazaki et al. |
| 2007/0134857 | A1* | 6/2007 | Suh .................. H01L 51/0002 438/149 |
| 2011/0031499 | A1* | 2/2011 | Kimura .................. H01L 27/124 257/59 |
| 2011/0108831 | A1 | 5/2011 | Jeong et al. |
| 2011/0168993 | A1 | 7/2011 | Jeon et al. |
| 2012/0018727 | A1* | 1/2012 | Endo .................. H01L 29/66742 257/57 |

FOREIGN PATENT DOCUMENTS

| | | |
|---|---|---|
| KR | 10-2005-0110905 | 11/2005 |
| KR | 10-2008-0088083 | 10/2008 |
| KR | 10-2010-0132308 A | 12/2010 |
| KR | 10-2011-0051478 | 5/2011 |
| KR | 10-2011-0081639 | 7/2011 |

\* cited by examiner

BACKPLANE FOR FLAT PANEL DISPLAY APPARATUS, METHOD OF MANUFACTURING THE BACKPLANE, AND ORGANIC LIGHT EMITTING DISPLAY APPARATUS INCLUDING THE BACKPLANE

CROSS-REFERENCE TO RELATED PATENT APPLICATION

This application is a continuation of U.S. patent application Ser. No. 13/705,152, filed on Dec. 4, 2012, which claims priority to and the benefit of Korean Patent Application No. 10-2012-0038168, filed on Apr. 12, 2012, in the Korean Intellectual Property Office, the disclosures of both of which are incorporated herein in their entirety by reference.

BACKGROUND

1. Field

The present invention relates to a backplane for a flat panel display apparatus, a method of manufacturing the backplane, and an organic light-emitting display apparatus including the backplane.

2. Description of the Related Art

A flat display apparatus, such as an organic light-emitting display apparatus, a liquid crystal display apparatus, or the like, is manufactured on an active-drive backplane including a plurality of pixels each including a thin film transistor (TFT) and a capacitor so as to embody a high-resolution display. In particular, a TFT using an oxide semiconductor has excellent device characteristics, and is manufactured at low temperature. Due to such features, such a TFT is regarded as an optimal device for a backplane of a flat panel display.

SUMMARY

Embodiments of the present invention provide a backplane that has a simple manufacturing process and excellent display qualities and may be used in a flat panel display apparatus, a method of manufacturing the backplane, and an organic light-emitting display apparatus including the backplane.

According to an embodiment, there is provided a backplane for a flat panel display apparatus, including a thin film transistor (TFT) on a substrate and including an active layer, a gate electrode, a source electrode, and a drain electrode; a light-blocking layer between the substrate and the TFT; a first insulating layer between the light-blocking layer and the TFT; and a capacitor including a first electrode on the same plane as the light-blocking layer, a second electrode on the first electrode, wherein the first insulating layer is between the first electrode and the second electrode; and a pixel electrode on the same plane as the light-blocking layer.

The active layer may include oxygen (O) and at least one element selected from the group consisting of gallium (Ga), phosphorus (In), zinc (Zn), hafnium (Hf), and tin (Sn).

Both the first electrode of the capacitor and the pixel electrode may include the same material as that of the light-blocking layer.

The light-blocking layer may include a material that has a smaller light transmission ratio than that of the active layer.

The backplane may further include a second insulating layer between the active layer and the gate electrode, and the first insulating layer may have a higher dielectric constant than that of the second insulating layer.

The second electrode of the capacitor may be formed on the same plane as the active layer, and the second insulating layer may be disposed on the second electrode.

The second electrode of the capacitor may be formed on the same plane as the active layer, and etched surfaces of the second insulating layer and the gate electrode may be flush with each other.

The backplane may further include a metal oxide layer on the gate electrode, and the metal oxide layer may extend to cover the second electrode.

The second electrode of the capacitor may be on the same plane as the active layer, and the second insulating layer may be on the second electrode.

The backplane may further include an alignment key on the same plane as the light-blocking layer.

The alignment key may include the same material as that of the light-blocking layer.

The backplane may further include a third electrode of the capacitor which is on the same plane as the source electrode and the drain electrode.

According to an embodiment, there is provided an organic light-emitting display apparatus including a thin film transistor (TFT) on a substrate and including an active layer, a gate electrode, a source electrode, and a drain electrode; a light-blocking layer between the substrate and the TFT; a first insulating layer between the light-blocking layer and the TFT; a capacitor including a first electrode on the same plane as the light-blocking layer, a second electrode on the first electrode, and the first insulating layer between the first electrode and the second electrode; and a pixel electrode on the same plane as the light-blocking layer; an opposite electrode on the pixel electrode; and an organic emission layer between the pixel electrode and the opposite electrode.

The active layer may include oxygen (O) and at least one element selected from the group consisting of gallium (Ga), phosphorus (In), zinc (Zn), hafnium (Hf), and tin (Sn).

Both the first electrode of the capacitor and the pixel electrode may include the same material.

The backplane may include a second insulating layer between the active layer and the gate electrode, and the first insulating layer may have a higher dielectric constant than that of the second insulating layer.

The pixel electrode may include a semi-transmissive metal layer.

The opposite electrode may be a reflective electrode.

According to an embodiment, there is provided a method of manufacturing a backplane for a flat panel display apparatus, the method including: in a first mask process, forming a light-blocking layer, a pixel electrode, and a first capacitor electrode; in a second mask process, forming a first insulating layer on the result of the first mask process, and forming an active layer of a thin film transistor (TFT) and a second capacitor electrode on the first insulating layer; in a third mask process, forming a second insulating layer on the result of the second mask process, and forming a gate electrode of the TFT on the second insulating layer; in a fourth mask process, forming a third insulating layer on the result of the third mask process, and forming an opening exposing a portion of the active layer in the third insulating layer; in a fifth mask process, forming a source electrode and a drain electrode of the TFT on the result of the fourth mask process; and in a sixth mask process, forming a fourth insulating layer on the result of the fifth mask process, and forming an opening exposing the pixel electrode in the fourth insulating layer.

According to an embodiment, there is provided a method of manufacturing a backplane for a flat panel display apparatus, the method including: in a first mask process, forming a light-blocking layer, a pixel electrode, and a first capacitor electrode; in a second mask process, forming a first insulating layer on the result of the first mask process, and forming a gate electrode of a thin film transistor (TFT) and a second capacitor electrode on the first insulating layer; in a third mask process, forming a second insulating layer on the result of the second mask process, and forming an active layer of the TFT on the second insulating layer; in a fourth mask process, forming a third insulating layer on the result of the third mask process, and forming an opening exposing a portion of the active layer in the third insulating layer; in a fifth mask process, forming a source electrode and a drain electrode of the TFT on the result of the fourth mask process; and in a sixth mask process, forming a fourth insulating layer on the result of the fifth mask process, and forming an opening exposing the pixel electrode in the fourth insulating layer.

In the first mask process, the light-blocking layer, the pixel electrode, and the first electrode may be formed of the same material on the same plane.

In the second mask process, the active layer of the TFT and the second capacitor electrode may be formed of the same material on the same plane.

In the third mask process, the active layer and the second capacitor electrode may be doped with ion impurities.

In the third mask process, the gate electrode and the second insulating layer may be etched so that etched surfaces thereof are flush with each other, and a metal oxide layer may be further formed on the gate electrode.

In the second mask process, the active layer of the TFT and the second capacitor electrode may be formed of the same material on the same plane.

In the first mask process, an alignment key may be further formed of the same material on the same plane as the light-blocking layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention are described in detail with reference to the attached drawings.

Figure 1:
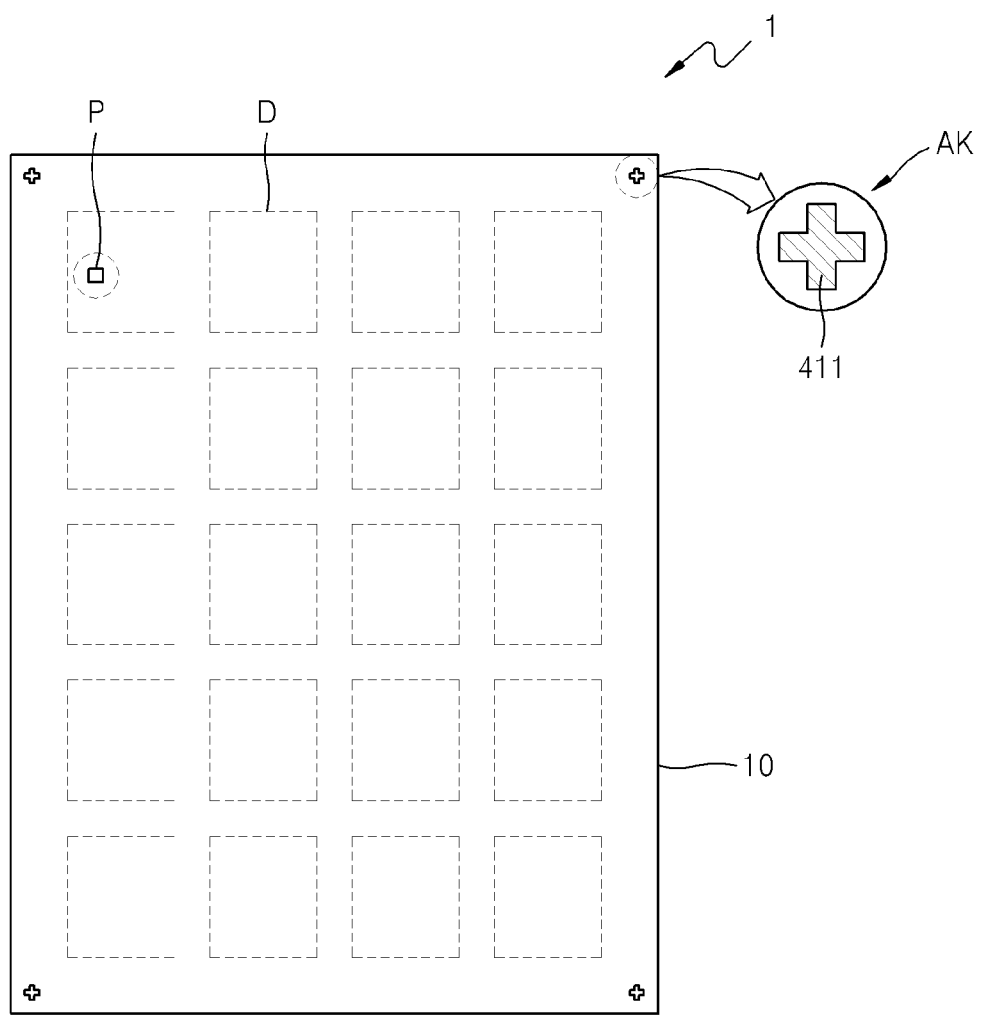
FIG. 1 is a schematic plan view illustrating a backplane for a flat panel display apparatus, according to an embodiment of the present invention.
Figure 2:
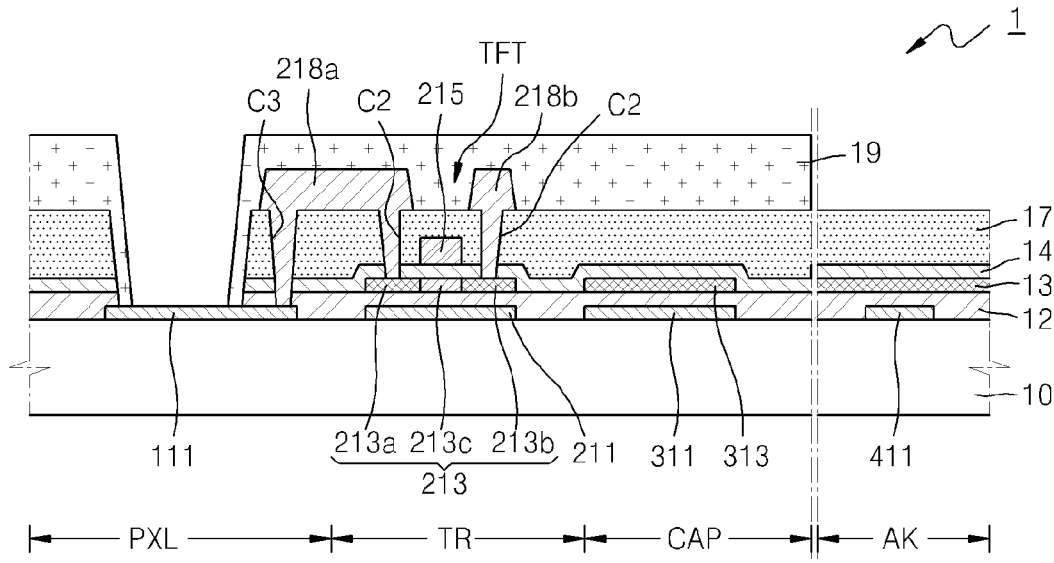
FIG. 2 is a cross-sectional view illustrating a pixel and an alignment key region illustrated in FIG. 1.

FIG. 1 is a schematic plan view illustrating a backplane 1 for a flat panel display apparatus, according to an embodiment of the present invention, and FIG. 2 is a cross-sectional view illustrating a pixel P and an alignment key region AK both illustrated in FIG. 1.

Referring to FIG. 1, the backplane 1 according to the present embodiment includes a plurality of display regions D each including a plurality of pixels P, and an alignment key region AK including an alignment key 411 near an edge of the backplane 1.

When a manufacturing process is completed, the display regions D of the backplane 1 are separated as a plurality of display panels, and the alignment key region AK is used as an alignment key during patterning of the backplane 1, and after the display regions D are separated as display panels, the alignment key region AK does not remain on the display panels.

Referring to FIG. 2, each of the pixels P included in each of the display regions D may include a transistor region TR including a thin film transistor (TFT), a capacitor region CAP including a capacitor, and a pixel electrode unit PXL including a pixel electrode 111. The pixel P illustrated in FIG. 2 includes one pixel electrode 111, one capacitor, and one TFT, but the structure of the pixel P is not limited thereto. For example, the pixel P may include at least one capacitor and at least one TFT.

The transistor region TR includes the TFT that is disposed on a substrate 10 and includes an active layer 213, a gate electrode 215, a source electrode 218a, a drain electrode 218b, and a light-blocking layer 211 that is between the TFT and the substrate 10.

In one embodiment, the substrate 10 may be formed of a glass material that mainly includes SiO2. According to another embodiment, the substrate 10 may also be formed of other materials, such as a plastic material.

The active layer 213 may include an oxide semiconductor. The oxide semiconductor may include at least one element selected from the group consisting of gallium (Ga), indium (In), zinc (Zn), hafnium (Hf), and tin (Sn). For example, the active layer 213 may include a material selected from InGaZnO, ZnSnO, InZnO, InGaO, ZnO, TiO, and hafnium-indium-zinc oxide (HIZO).

In the present embodiment, the active layer 213 may include a channel region 213c, a source region 213a, and a drain region 213b that are outside the channel region 213c. In one embodiment, the source region 213a and the drain region 213b are n+ type or p+ type ion impurity-doped regions, and may have improved current mobility to improve device characteristics of the TFT.

The gate electrode 215 is disposed on the active layer 213, and a second insulating layer 14 functioning as a gate insulating film is disposed between the active layer 213 and the gate electrode 215.

A third insulating layer 17 functioning as an interlayer insulating film is disposed on the second insulating layer 14, and the source electrode 218a and the drain electrode 218b are disposed on the third insulating layer 17. The source electrode 218a and the drain electrode 218b are respectively connected to the source region 213a and the drain region 213b of the active layer 213 through openings C2 passing through the second insulating layer 14 and the third insulating layer 17.

A TFT including an oxide semiconductor as described above has excellent device characteristics, and can be manufactured at low temperature. Due to such features, such a TFT is regarded as an optimal device for a backplane for a flat panel display. Also, a TFT including an oxide semiconductor may have transparent characteristics in a visible light region and flexibility, and thus, is used in a transparent display apparatus or a flexible display apparatus. However, the TFT including an oxide semiconductor is susceptible to light.

However, the backplane 1 according to the present embodiment includes the light-blocking layer 211 between the substrate 10 and the TFT, in particular, between the substrate 10 and the active layer 213, so that light reliability of the TFT may be improved. In this aspect, the light-blocking layer 211 may be formed of a material that has a small light transmission ratio.

Also, one of the source electrode 218a and the drain electrode 218b is connected to the pixel electrode 111 of the pixel electrode unit PXL through an opening C3. In the present embodiment, the source electrode 218a is connected to the pixel electrode 111, but this structure is an example only. For example, according to another embodiment, the pixel electrode 111 may be connected to the drain electrode 218b.

Also, the TFT according to the present embodiment is a driving TFT in which one of the source electrode 218a and the drain electrode 218b is directly connected to the pixel electrode 111. However, as described above, the backplane 1 according to the present embodiment may further include other TFTs.

The pixel electrode 111 and the light-blocking layer 211 may be formed of the same material on the same plane. In one embodiment, the pixel electrode 111 may also be formed of a material that has a small light transmission ratio.

In the capacitor region CAP, a first electrode 311 and a second electrode 313 of the capacitor are disposed on the substrate 10 with the first insulating layer 12 interposed therebetween.

The first electrode 311, the pixel electrode 111, and the light-blocking layer 211 may be formed of the same material on the same plane. The second electrode 313 and the active layer 213 may be formed of the same material on the same plane. Since the second electrode 313 is doped with ion impurities, the capacitance of a capacitor may be increased compared to when ion impurities are not doped.

Also, since the first electrode 311 and the light-blocking layer 211 may be formed on the same plane, and the second electrode 313 and the active layer 213 may be formed on the same plane, the first insulating layer 12 that is disposed between the light-blocking layer 211 and the active layer 213, extends to the capacitor region CAP and functions as a dielectric film of the capacitor. That is, in the present embodiment, the second insulating layer 14 functioning as a gate insulating film is disposed on the second electrode 313 and does not function as a dielectric film of the capacitor.

In a TFT including an oxide semiconductor, a bottom gate structure is often used. However, a typical bottom gate structure is not suitable for a large-size display. Hereinafter, some reasons therefore are described below with reference to FIG. 3.

Figure 3:
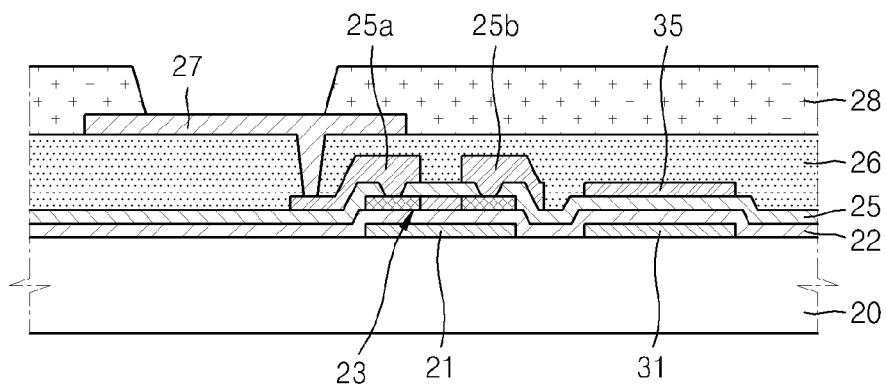
FIG. 3 is a schematic cross-sectional view illustrating a pixel having a bottom gate structure of a backplane for a flat panel display apparatus, according to a comparative embodiment.

FIG. 3 is a schematic cross-sectional view illustrating a pixel having a bottom gate structure of a backplane for a flat panel display apparatus, according to a comparative example.

Referring to FIG. 3, a gate electrode 21 of a TFT and a first electrode 31 of a capacitor are disposed on a substrate 20 and are formed of the same material, and a first insulating layer 22 is disposed on the gate electrode 21 and the first electrode 31. An active layer 23 is disposed on the first insulating layer 22, and a source electrode 25a and a drain electrode 25b are disposed on the active layer 23. A second insulating layer 25 is disposed between the active layer 23 and both the source electrode 25a and the drain electrode 25b, and a second electrode 35 of the capacitor is disposed on the second insulating layer 25. A third insulating layer 26 is disposed on the source electrode 25a, the drain electrode 25b, and the second electrode 35, and a pixel electrode 27 is disposed on the third insulating layer 26. A fourth insulating layer 28 exposing a portion of the pixel electrode 27 is disposed on the third insulating layer 26.

In the present comparative example, regarding a bottom gate structure in which the gate electrode 21 is located under the active layer 23, thicknesses of the gate electrode 21, and an interconnection line (not shown) formed on the same plane as the gate electrode 21 are increased to embody a low-resistance interconnection line. In a subsequent process, the thickness of the first insulating layer 22 functioning as a gate insulating film is increased to form other device layers on the gate electrode 21 and the interconnection line (not shown).

In the comparative example, the first insulating layer 22 functions as a gate insulating film and a dielectric film of a capacitor. Accordingly, the thickness of the first insulating layer 22 is increased, and the capacitance of the capacitor is decreased. Also, due to the increasing demand for an interconnection line having low resistance for large-size displays, it becomes difficult to embody a capacitor having a sufficient capacitance.

However, referring to FIG. 2, regarding the backplane 1 according to the present embodiment, the second insulating layer 14 functioning as a gate insulating film is not used as a dielectric film for the capacitor, so that even when thicknesses of the gate electrode 215 and an interconnection line (not shown) formed on the same plane as the gate electrode 215 are increased, the capacitance of the capacitor is not substantially affected.

The first insulating layer 12 functioning as the dielectric film for the capacitor may be formed of a material that has a higher dielectric constant than the second insulating layer 14 functioning as the gate insulating film.

Also, a backplane for a flat panel display apparatus may be manufactured by using photo-mask processes, and an alignment key is formed near an edge of the backplane to accurately align patterns during the respective photo-mask processes.

Regarding the backplane 1 according to the present embodiment, the active layer 213 including an oxide semiconductor is disposed under the gate electrode 215, and when the alignment key 411 is formed of an oxide semiconductor, it may be difficult to use the alignment key 411 due to the transparency of the oxide semiconductor.

However, according to the present embodiment, this problem is addressed by forming the alignment key 411 in the alignment key region AK by using the same material used to form the light-blocking layer 211. Also, the alignment key 411 may be formed of a material that has a smaller light transmission ratio than the oxide semiconductor included in the active layer 213.

Also, the alignment key 411 illustrated in FIG. 1 has a cross shape '+'. However, this shape is an example only, and embodiments of the present invention are not limited thereto, and the alignment key 411 may have various other shapes.

Also, although the capacitor illustrated in FIG. 2 includes the first electrode 311 and the second electrode 313, embodiments of the present invention are not limited thereto. To increase the capacitance of the capacitor, a third electrode (not shown) may be further disposed in parallel to the first electrode 311 and the second electrode 313. In this regard, the third electrode, the source electrode 218a, and the drain electrode 218b may be formed of the same material on the same plane.

Hereinafter, FIGS. 4A through 4F are schematic cross-sectional views illustrating a method of manufacturing a backplane for a flat panel display apparatus, according to an embodiment of the present invention.

Figure 4A:
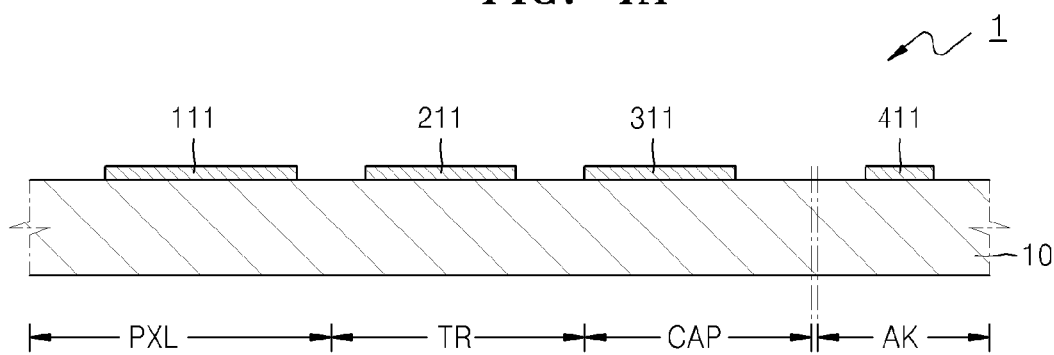
FIGS. 4A-4F are schematic cross-sectional views illustrating a method of manufacturing a backplane for a flat panel display apparatus, according to an embodiment of the present invention.

FIG. 4A is a schematic cross-sectional view illustrating the result of a first mask process performed on the backplane 1 according to the present embodiment.

Referring to FIG. 4A, the pixel electrode 111, the light-blocking layer 211, the first electrode 311 of the capacitor, and the alignment key 411 are formed on the substrate 10 in the first mask process. Although not illustrated, a buffer layer (not shown) including SiO2 and/or SiNx may be further disposed between the substrate 10 and the pixel electrode 111, the light-blocking layer 211, the first electrode 311, and the alignment key 411, so that the substrate 10 is planarized and permeation of ion impurities can be prevented or reduced.

In one embodiment, a layer (not shown) for forming the light-blocking layer is deposited on the substrate 10, a photoresist (not shown) is deposited on the layer for forming the light-blocking layer, and then, a photolithography process is performed thereon by using a first mask (not shown) to concurrently (e.g., simultaneously) form the pixel electrode 111, the light-blocking layer 211, the first electrode 311, and the alignment key 411. The first mask process, including photolithography, is performed by using a series of processes including developing, etching, and stripping and ashing, and followed by light exposure using a first mask (not shown) by an exposing apparatus (not shown). Hereinafter, when subsequent mask processes are described, the same description will be omitted.

Figure 4B:
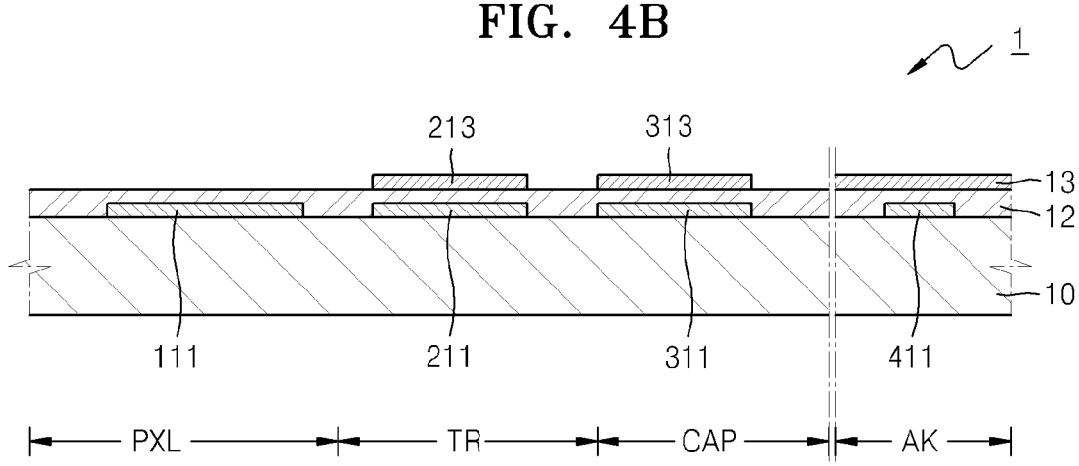

FIG. 4B is a schematic cross-sectional view illustrating the result of a second mask process performed on the backplane 1 according to the present embodiment.

A first insulating layer 12 is formed on the result of the first mask process, and an oxide semiconductor layer 13 is formed on the first insulating layer 12. Then, the oxide semiconductor layer 13 is patterned to form the active layer 213 of the TFT, and the second electrode 313 of the capacitor. In this regard, in the alignment key region AK, the alignment key 411 formed of the same material as the light-blocking layer 311 may function as an alignment key of the second mask process.

Figure 4C:
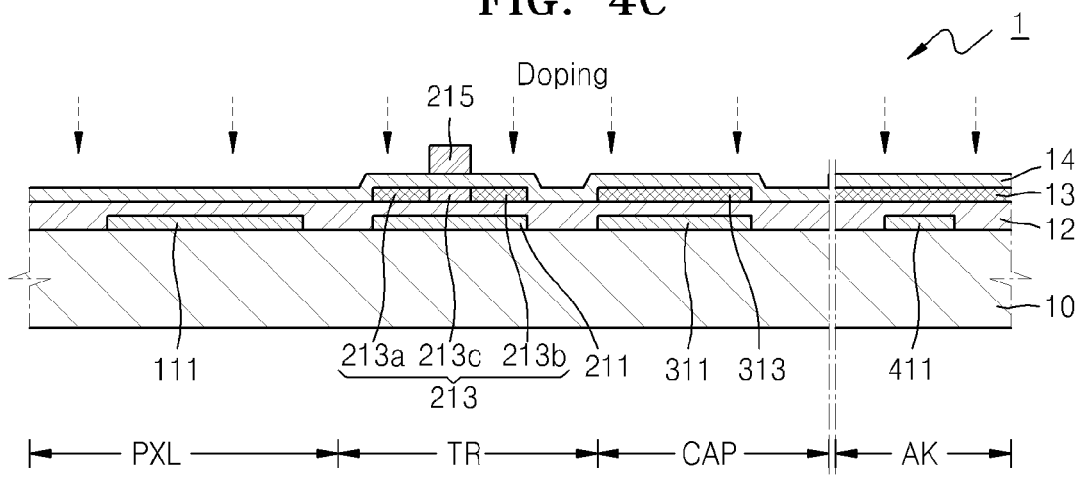

FIG. 4C is a schematic cross-sectional view illustrating the result of a third mask process performed on the backplane 1 according to the present embodiment.

The second insulating layer 14 is formed on the result of the second mask process, a conductive layer (not shown) is formed on the second insulating layer 14, and then, the conductive layer (not shown) is patterned to form the gate electrode 215, and an interconnection line layer (not shown).

As described above, even when the gate electrode 215 and the interconnection line layer (not shown) formed on the same plane as the gate electrode 215 have great thicknesses, since the second insulating layer 14, which is a gate insulating film, does not function as the dielectric film of the capacitor, a decrease in the capacitance of the capacitor may be prevented or reduced.

Following the formation of the gate electrode 215, the source region 213a and the drain region 213b of the active layer 213 may be doped with ion impurities by using the gate electrode 215 as a self-aligned mask. In this regard, the second electrode 313 of the capacitor formed on the same plane as the active layer 213 may also be doped with ion impurities. The TFT may have improved current mobility in the region doped with ion impurities to improve device characteristics, and the second electrode 313 of the capacitor doped with ion impurities may improve the capacitance of the capacitor.

Also, since in the alignment key region AK, a transparent oxide semiconductor layer 13 is formed on the alignment key 411, the alignment key 411 may still be used as an alignment key of a third mask process.

Also, in FIG. 4C, in the alignment key region AK, the oxide semiconductor layer 13 remains above the alignment key 411. However, embodiments of the present invention are not limited thereto. For example, the oxide semiconductor layer 13 may be removed. However, even if the oxide semiconductor layer 13 is not removed, the alignment key 411 may still be used as an alignment key of the third mask process due to the transparency of the oxide semiconductor layer 13.

Figure 4D:
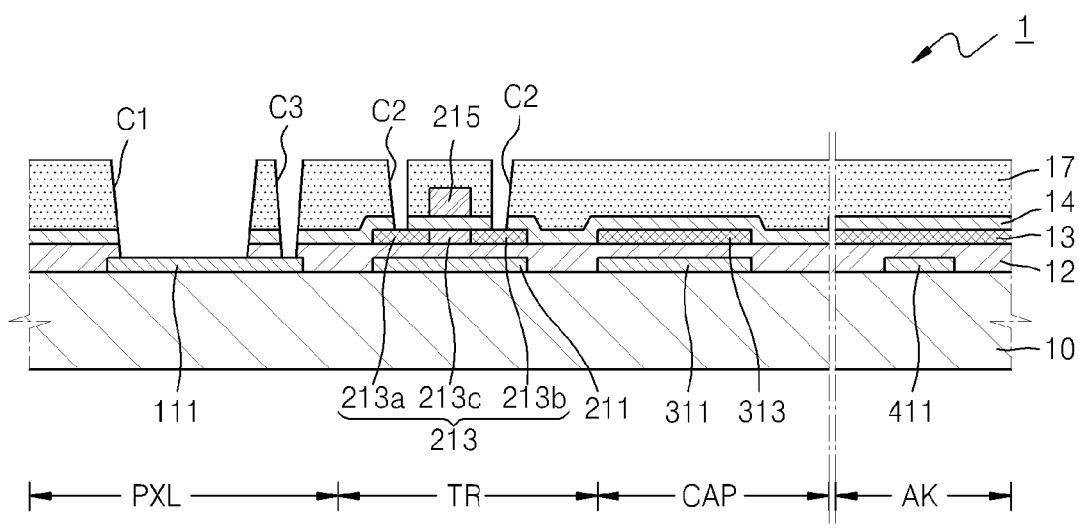

FIG. 4D is a schematic cross-sectional view illustrating the result of a fourth mask process performed on the backplane 1 according to the present embodiment.

A third insulating layer 17 is formed on the result of the third mask process, and the openings C1, C2, and C3 are formed. In the pixel electrode unit PXL, portions of the first insulating layer 12, the second insulating layer 14, and the third insulating layer 17 are removed to form the openings C1 and C3 exposing the pixel electrode 111. In the transistor region TR, portions of the second insulating layer 14 and the third insulating layer 17 are removed to form the openings C2 exposing the source region 213a and the drain region 213b.

Figure 4E:
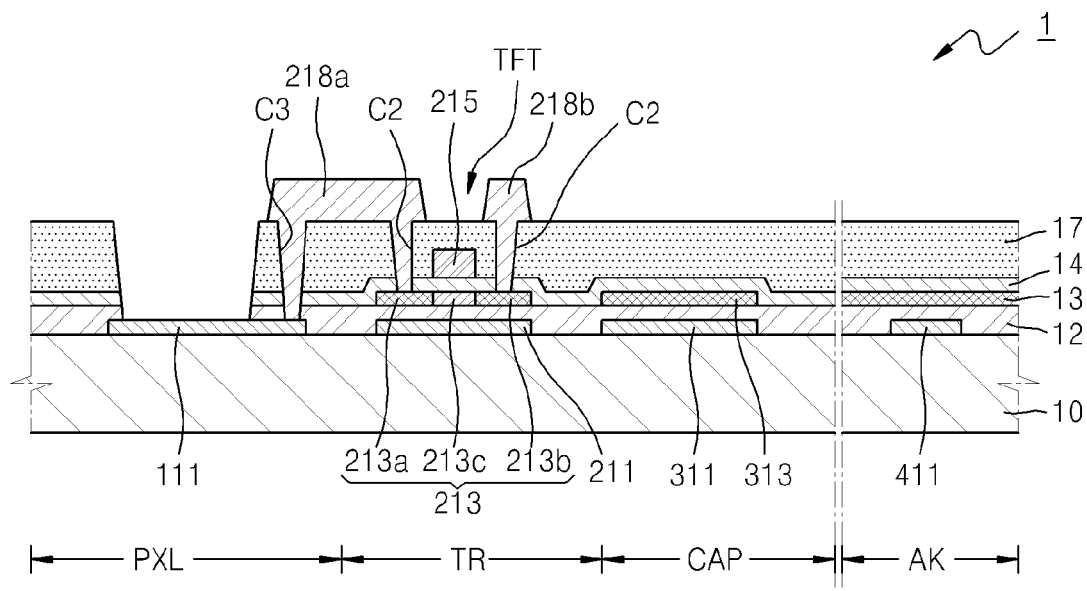

FIG. 4E is a schematic cross-sectional view illustrating the result of a fifth mask process performed on the backplane 1 according to the present embodiment.

A material for forming the source and drain electrodes 218a and 218b is deposited to cover the openings C1, C2, and C3 formed in the fourth mask process, followed by patterning, thereby forming the source electrode 218a and the drain electrode 218b. In several embodiments, although not illustrated in FIG. 4E, a third electrode (not shown) of the capacitor may be further formed on the third insulating layer 17.

Figure 4F:
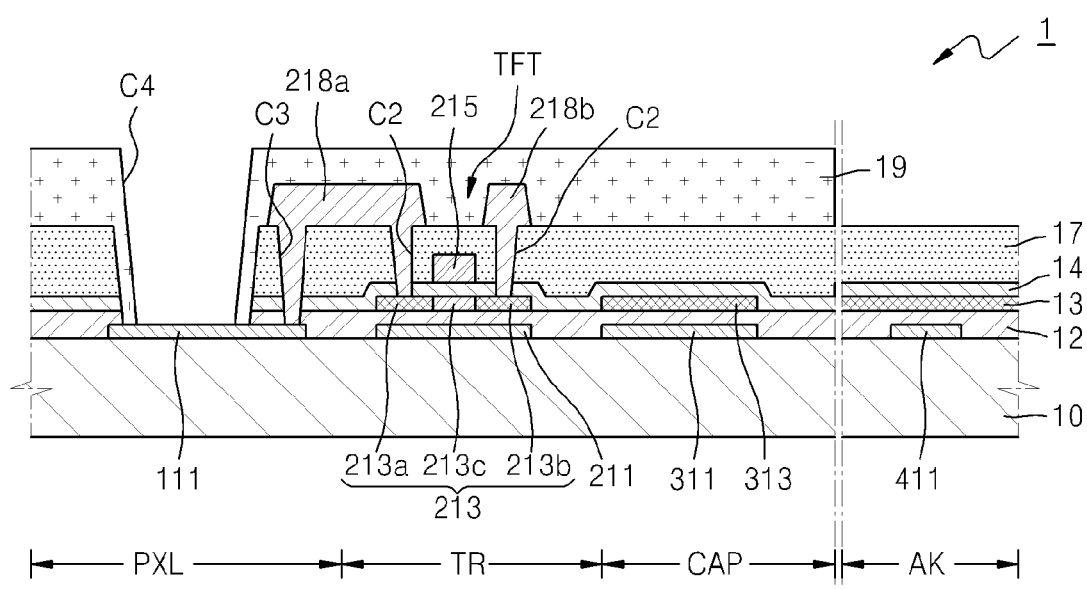

FIG. 4F is a schematic cross-sectional view illustrating the result of a sixth mask process performed on the backplane 1 according to the present embodiment.

A fourth insulating layer 19 is formed on the result of the fifth mask process, and a portion of the fourth insulating layer 19 is removed to form an opening C4 exposing the pixel electrode 111.

As described above, according to the method of manufacturing the backplane 1 for a flat panel display apparatus, according to the present embodiment, the backplane 1 is produced relatively simply by using a total of six mask processes.

The backplane 1 formed using the method described above is divided into a plurality of display regions D, that is, a plurality of flat panel display apparatuses, and in this embodiment, the alignment key region AK located at the periphery (e.g., corners) of the backplane 1 are not present in the final flat panel display apparatuses.

Figure 5:
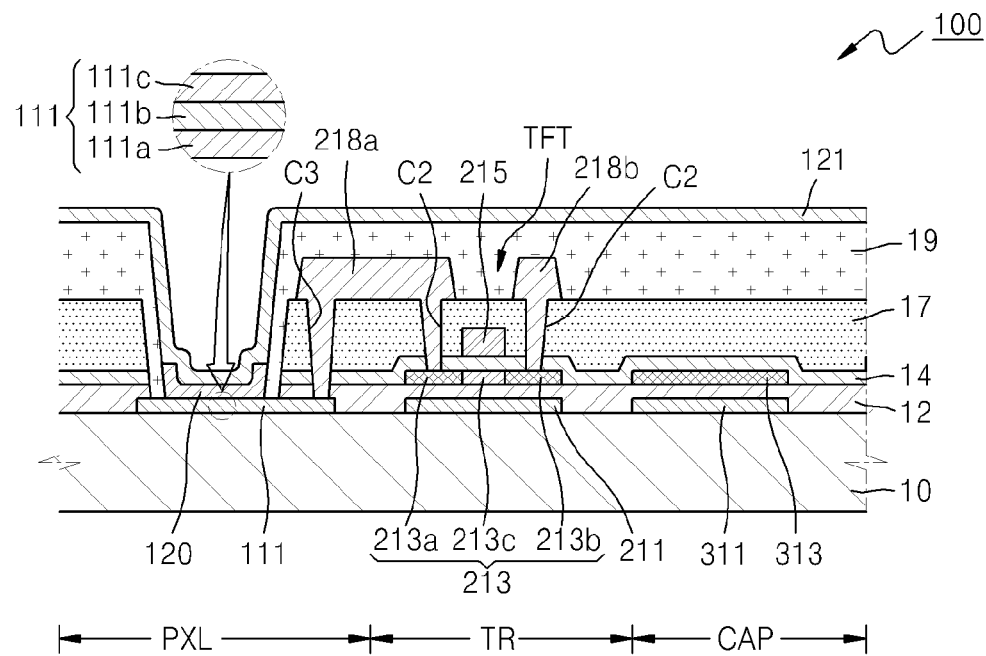
FIG. 5 is a schematic cross-sectional view of a pixel of an organic light-emitting display apparatus formed by separating a display region of the backplane of FIG. 1.

FIG. 5 is a schematic cross-sectional view of a pixel P of an organic light-emitting display apparatus 100 formed by separating the display regions D of the backplane 1 according to the previous embodiment.

The organic light-emitting display apparatus 100 may further include an organic emission layer 120 and an opposite electrode 121, in addition to the other structures of the pixel P of FIG. 2.

The organic emission layer 120 is formed on the pixel electrode 111, and the opposite electrode 121 is formed as an opposite electrode on the organic emission layer 120. Regarding the organic light-emitting display apparatus 100 according to one embodiment, the pixel electrode 111 may be an anode, and the opposite electrode 121 may be a cathode. However, according to another embodiment, polarities of these electrodes may be reversed.

The organic emission layer 120 may be formed of a low-molecular weight organic material or a polymer organic material. When the organic emission layer 120 is a low-molecular weight organic material, for example, a hole transport layer (HTL), a hole injection layer (HIL), or the like, may be deposited on one side of the organic emission layer 120, and an electron transport layer (ETL), an electron injection layer (EIL), or the like may be deposited on the other side of the organic emission layer 120. In several embodiments, various other layers may be deposited on the organic emission layer 120. The organic emission layer 120 may include an organic material such as copper phthalocyanine (CuPc), N'-Di(naphthalene-1-yl)-N,N'-diphenyl-benzidine (NPB), tris-8-hydroxyquinoline aluminum (Alq3), or the like. Also, when the organic emission layer 120 includes a polymer organic material, an HTL may be further included in addition to the organic emission layer 120. Examples of a material for forming the HTL are poly-(3,4)-ethylenedihydroxy thiophene (PEDOT), polyaniline (PANI), etc. The polymer organic material may include an organic material such as polyphenylene vinylene (PPV) or polyfluorene.

Light emitted from the organic emission layer 120 may progress in a direction toward the substrate 10 or in an opposite direction thereof. When the opposite electrode 121 is formed as a common electrode, a voltage drop of the opposite electrode 121 may lead to different amplitudes of the current applied to the respective pixels. In particular, the larger a display apparatus, the greater the voltage drop. Accordingly, it is desirable to reduce the resistance of the opposite electrode 121.

As a way to reduce the resistance of the opposite electrode 121, either the opposite electrode 121 may be formed of a low-resistance material or the thickness of the opposite electrode 121 may be increased. In several embodiments, the opposite electrode 121 is formed of a low-resistance material selected from Al, Mg, Li, Ca, LiF/Ca, and LiF/Al, and is formed to have a set or predetermined thickness. In this regard, the opposite electrode 121 may function as a reflective electrode.

Also, since the layer for forming the pixel electrode 111 also forms the light-blocking layer 211 and the alignment key (411, see FIG. 2), the pixel electrode 111 may be formed of a material that has a low light transmission ratio. For example, the pixel electrode 111 may include a semi-transmissive metal layer 111b. The pixel electrode 111 may be a multi-layer including a first layer 111a including a transparent conductive oxide, the semi-transmissive metal layer 111b, and a second layer 111c including a transparent conductive oxide. In this regard, the first layer 111a and the third layer 111c may each include at least one selected from indium tin oxide (ITO), indium zinc oxide (IZO), zinc oxide (ZnO), indium oxide (In2O3), indium gallium oxide (IGO), and aluminum zinc oxide (AZO). The semi-transmissive metal layer 111b may include silver (Ag).

As described above, when the pixel electrode 111 includes the semi-transmissive metal layer 111b, and the opposite electrode 121 is formed as a reflective electrode, the pixel electrode 111 and the opposite electrode 121 respectively function as a semi-transmissive mirror and a reflective mirror to form a resonant structure, thereby increasing light extraction efficiency of the organic light-emitting display apparatus 100. That is, light emitted from the organic emission layer 120 has a resonance between the opposite electrode 121 and the pixel electrode 111, and then progresses toward the substrate 10 through the pixel electrode 111.

Hereinafter, a backplane 2 for a flat panel display apparatus, according to another embodiment, is described below with reference to FIG. 6.

Figure 6:
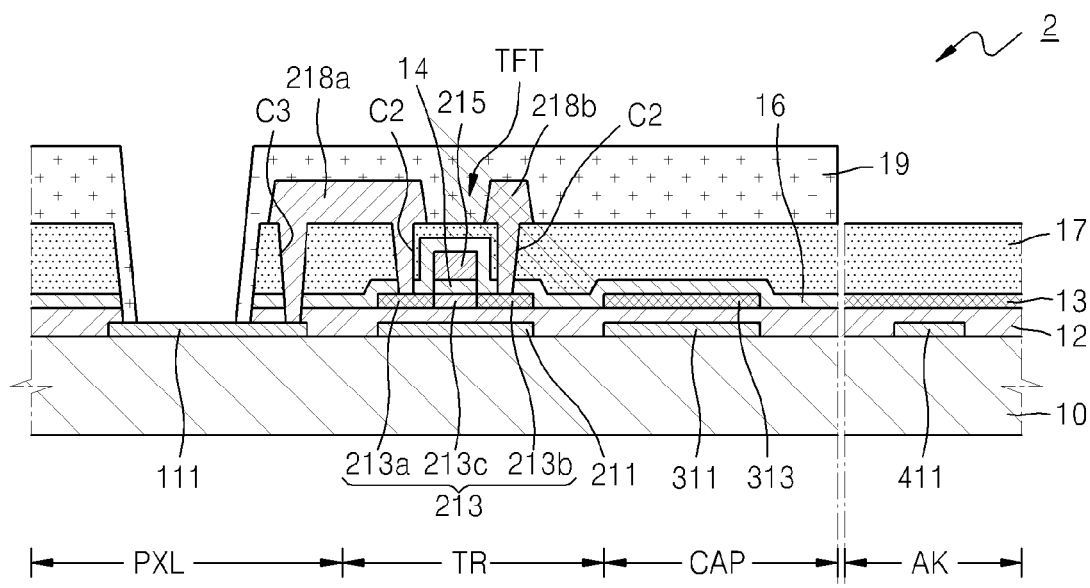
FIG. 6 is a schematic cross-sectional view of a pixel and an alignment key region of a backplane for a flat panel display apparatus, according to another embodiment of the present invention.

FIG. 6 is a schematic cross-sectional view illustrating a pixel P and an alignment key region AK of the backplane 2. Hereinafter, a description thereof is presented based on the difference between the backplane 2 according to the present embodiment and the backplane 1 according to the previous embodiment.

Referring to FIG. 6, the transistor region TR includes a TFT that is disposed on the substrate 10, and the light-blocking layer 211 that is disposed between the TFT and the substrate 10. Here, the TFT includes the active layer 213, the gate electrode 215, and the source electrode 218a and the drain electrode 218b. The active layer 213 includes the channel region 213c, and the source region 213a and the drain region 213b which are disposed outside the channel region 213c and are doped with ion impurities. The gate electrode 215 is disposed to correspond to the channel region 213c.

In the present embodiment, the second insulating layer 14 disposed between the channel region 213c and the gate electrode 215 is formed on the channel region 213c, but, unlike in the previous embodiment, the second insulating layer 14 is not formed on the second electrode 313 of the capacitor.

Instead, in the present embodiment, a metal oxide layer 16 is further disposed between the gate electrode 215 and the third insulating layer 17. The metal oxide layer 16 may be formed by heat treating a metal layer (not shown), thereby increasing concentrations of ion impurities of the source region 213a and the drain region 213b, the active layer 313, and the oxide semiconductor layer 13.

Figure 7A:
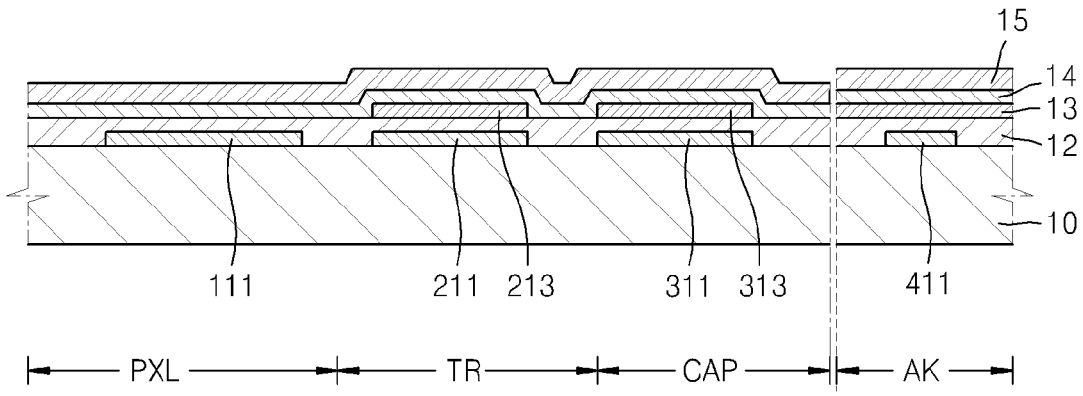
FIGS. 7A to 7C are cross-sectional views illustrating a third mask process for forming the backplane of FIG. 6.
Figure 7B:
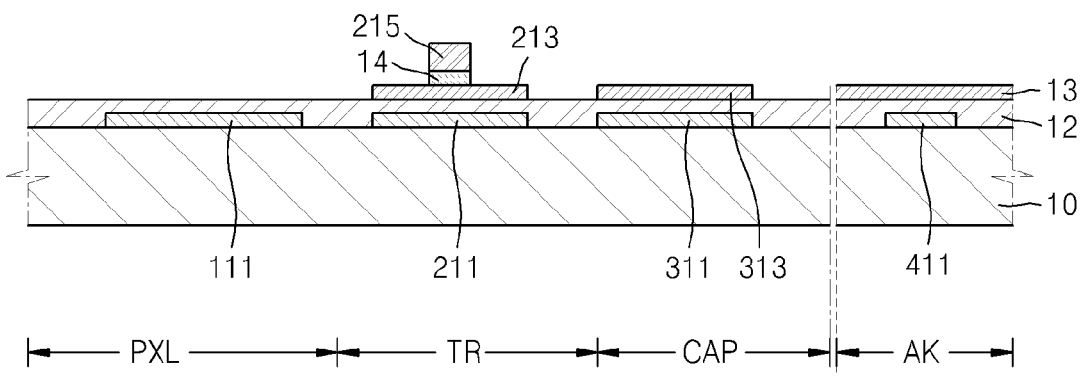
Figure 7C:
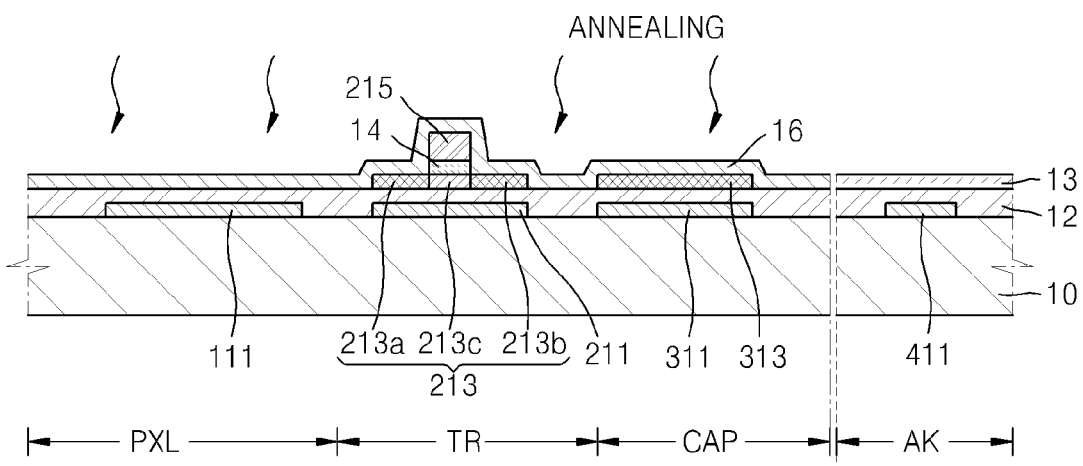

FIGS. 7A to 7C are cross-sectional views illustrating a third mask process to form the backplane 2. The first and second mask processes are the same as those described according to the previous embodiments.

Referring to FIG. 7A, the second insulating layer 14 and a layer 15 for forming a gate electrode are sequentially deposited on the result (see FIG. 4B) of the second mask process, and then, are concurrently (e.g., simultaneously) patterned.

Referring to 7B, the second insulating layer 14 is removed (e.g., etched) except for only a portion of the second insulating layer 14 which corresponds to the gate electrode 215. In this regard, since layer 15 and the second insulating layer 14 are etched concurrently (e.g., simultaneously), the etched side surfaces thereof are flush with each other.

Referring to FIG. 7C, a metal layer (not shown) is deposited on the result of FIG. 7B, and then, annealing is performed thereon, thereby forming the metal oxide layer 16. Due to the annealing and the metal oxide layer 16, concentrations of ion impurities of the source region 213a and the drain region 213b, the active layer 313, and the oxide semiconductor layer 13 of the alignment key region AK are increased. The metal oxide layer 16 may include various metals, for example, aluminum (Al).

According to the present embodiment, concentrations of ion impurities doped in the oxide semiconductor layer may be increased by using the metal oxide layer 16 instead of a doping process. Also, the metal oxide layer 16 may function as a protection layer for protecting the active layer 213 by preventing or reducing permeation of external impurities.

Referring to FIG. 6, the third insulating layer 17 functioning as an interlayer insulating film is disposed on the metal oxide layer 16, and the source electrode 218a and the drain electrode 218b are disposed on the third insulating layer 17. The source electrode 218a and the drain electrode 218b are respectively connected to the source region 213a and the drain region 213b of the active layer 213 through the openings C2 formed through the metal oxide layer 16 and the third insulating layer 17.

In the present embodiment, like in the previous embodiments, the light-blocking layer 211 is disposed between the substrate 10 and the TFT, and in particular, between the substrate 10 and the active layer 213 so as to improve light reliability of the TFT.

In the capacitor region CAP, the first electrode 311 and the second electrode 313 are disposed on the substrate 10 with the first insulating layer 12 interposed therebetween, and since the second electrode 313 includes ion impurities, the capacitance of the capacitor is improved compared to when ion impurities are not doped.

Also, since the second insulating layer 14 functioning as a gate insulating film is not included in the capacitor, only characteristics of the second insulating layer 14 with respect to the TFT need to be taken into consideration. That is, since the second insulating layer 14 functioning as a gate insulating film does not function as a dielectric film of the capacitor, even when the gate electrode 215 and an interconnection line (not shown) formed on the same plane as the gate electrode 215 have great thicknesses, the capacitance of the capacitor may not be substantially affected.

Also, in the alignment key region AK, the same material as the light-blocking layer 211 is patterned for use as the alignment key 411 disposed under the layer 13 including an oxide semiconductor, so that a mask process is smoothly performed.

Figure 8:
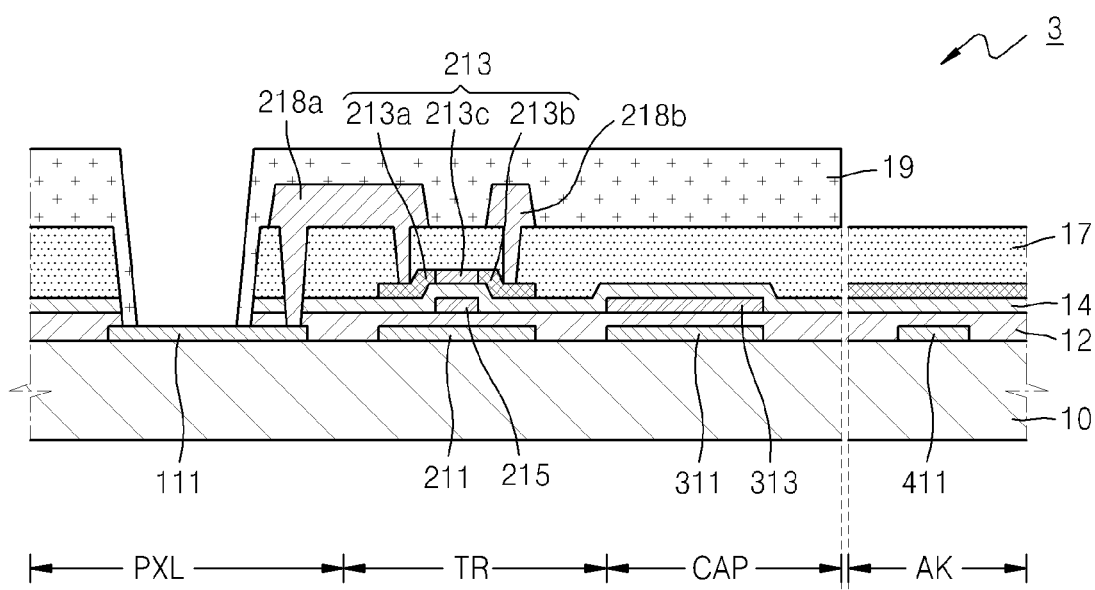
FIG. 8 is a schematic cross-sectional view of a pixel and an alignment key region of a backplane for a flat panel display apparatus, according to another embodiment of the present invention.

FIG. 8 is a schematic cross-sectional view illustrating a pixel P and an alignment key region AK of a backplane 3 for a flat panel display apparatus, according to another embodiment of the present invention. Hereinafter, a description thereof is presented based on the difference between the backplane 3 according to the present embodiment and those according to the previous embodiments.

Referring to FIG. 8, in the transistor region TR, a TFT is disposed on the substrate 10, and the light-blocking layer 211 is disposed between the TFT and the substrate 10. Here, the TFT includes a gate electrode 215, an active layer 213, and a source electrode 218a and a drain electrode 218b. The active layer 213 includes the channel region 213c, and the source region 213a and the drain region 213b which are disposed outside the channel region 213c and are doped with ion impurities. The gate electrode 215 is disposed under the channel region 213c. Unlike in the previous embodiments, the TFT according to the present embodiment has a bottom gate structure in which the gate electrode 215 is disposed under the active layer 213.

However, in the present embodiment, like in the previous embodiments, the light-blocking layer 211 is located between the substrate 10 and the TFT, in particular, between the substrate 10 and the gate electrode 215 so as to improve light reliability of the TFT.

In the capacitor region CAP, the first electrode 311 and the second electrode 313 of the capacitor are disposed on the substrate 10 with the first insulating layer 12 interposed therebetween. Here, the first electrode 311 and the light-blocking layer 211 may be formed of the same material on the same plane, and the second electrode 313 and the gate electrode 215 may be formed of the same material on the same plane. Accordingly, the capacitance of the capacitor according to the present embodiment may be increased compared to a capacitor having an electrode that includes an oxide semiconductor that is not doped with ion impurities.

Also, since the second insulating layer 14 functioning as a gate insulating film is disposed on the second electrode 313 of the capacitor and is not used as a dielectric film of the capacitor, the second insulating layer 14 is designed in consideration of the characteristics of the TFT. That is, since the second insulating layer 14 functioning as the gate insulating film does not function as a dielectric film of the capacitor, even when the gate electrode 215 and an interconnection line (not shown) formed on the same plane as the gate electrode 215 have great thicknesses, the capacitance of the capacitor is not substantially affected.

Also, in the alignment key region AK, the same material used as the light-blocking layer 211 is patterned to form the alignment key 411 disposed under the layer 13 including an oxide semiconductor, so that a mask process is smoothly performed.

Also, the backplanes 2 and 3 of FIGS. 6 and 8, respectively, are divided into a plurality of display regions D (see FIG. 1), and may also be applied to an organic light-emitting display apparatus (not shown) wherein each pixel P further includes the organic emission layer 120 (see FIG. 5) and the opposite electrode 121 (see FIG. 5).

The description presented above is made with reference to an organic light-emitting display apparatus, but the present invention is not limited thereto. For example, the embodiments of the present invention may be applied to a liquid crystal display apparatus including liquid crystals, instead of an organic emission layer. Also, the embodiments of the present invention may be applied to other display apparatuses.

A backplane for a flat panel display apparatus, a method of manufacturing the backplane, and an organic light-emitting display apparatus including the backplane, according to embodiments of the present invention, provide the following effects:

First, a light-blocking layer is formed between a substrate and a TFT to improve light reliability of the TFT.

Second, a dielectric film is formed under a gate electrode, so that even when the gate electrode and an interconnection line formed on the same plane as the gate electrode have great thicknesses, a decrease in the capacitance of a capacitor may be prevented or reduced.

Third, a dielectric film is formed in a small thickness, so that the capacitance of a capacitor may be increased and an aperture ratio of a bottom-emission type display apparatus may be increased.

Fourth, use of an alignment key that has a smaller light transmission ratio than that of an oxide semiconductor enables accurate alignment.

Fifth, the number of mask processes is reduced, thereby reducing manufacturing costs.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A backplane comprising:
a substrate;
a thin film transistor (TFT) on the substrate and the TFT comprising:
    an active layer comprising oxygen (O) and at least one element selected from the group consisting of gallium (Ga), indium (In), zinc (Zn), hafnium (Hf), and tin (Sn), wherein the active layer comprises a channel region and a source region and a drain region with ion impurities which are disposed outside the channel region;
    a gate electrode on the active layer; and
    a source electrode and a drain electrode respectively connected to the source region and the drain region;
a light-blocking layer between the substrate and the active layer;
a first insulating layer between the light-blocking layer and the active layer;
a second insulating layer between the channel region and the gate electrode; and
a pixel electrode on the substrate, the pixel electrode and the light-blocking layer having substantially the same light transmission ratio, the pixel electrode being coplanar with and having substantially the same thickness as the light-blocking layer.

2. The backplane of claim 1, further comprising a capacitor comprising a first electrode and a second electrode on the first electrode, wherein the first insulating layer is between the first electrode and the second electrode.

3. The backplane of claim 2, wherein the first electrode of the capacitor is disposed on the same plane as the light-blocking layer.

4. The backplane of claim 2, further comprising a metal oxide layer on the gate electrode, wherein the metal oxide layer extends to cover the second electrode.

5. The backplane of claim 1, wherein the pixel electrode is disposed on the same plane as the light-blocking layer.

6. The backplane of claim 1, wherein the pixel electrode comprises the same material as the light-blocking layer.

7. The backplane of claim 1, wherein the light-blocking layer comprises a material that has a smaller light transmission ratio than that of the active layer.

8. The backplane of claim 1, wherein the first insulating layer has a higher dielectric constant than that of the second insulating layer.

9. The backplane of claim 1, wherein etched surfaces of the second insulating layer and the gate electrode are flush with each other.

10. The backplane of claim 1, further comprising an alignment key on the same plane as the light-blocking layer.

11. The backplane of claim 10, wherein the alignment key comprises the same material as the light-blocking layer.

12. An organic light-emitting display apparatus comprising:
a substrate;
a thin film transistor (TFT) on the substrate and the TFT comprising:
    an active layer comprising oxygen (O) and at least one element selected from the group consisting of gallium (Ga), indium (In), zinc (Zn), hafnium (Hf), and tin (Sn), wherein the active layer comprises a channel region and a source region and a drain region with ion impurities which are disposed outside the channel region;
    a gate electrode on the active layer; and
    a source electrode and a drain electrode respectively connected to the source region and the drain region;
a light-blocking layer between the substrate and the active layer;
a first insulating layer between the light-blocking layer and the active layer;
a pixel electrode on the substrate, the pixel electrode and the light-blocking layer having substantially the same light transmission ratio, the pixel electrode being coplanar with and having substantially the same thickness as the light-blocking layer;
an opposite electrode on the pixel electrode; and
an organic emission layer between the pixel electrode and the opposite electrode.

13. The organic light-emitting display apparatus of claim 12, further comprising a capacitor comprising a first electrode and a second electrode on the first electrode, wherein the first insulating layer is between the first electrode and the second electrode.

14. The organic light-emitting display apparatus of claim 13, wherein the first electrode of the capacitor is disposed on the same plane as the light blocking layer.

15. The organic light-emitting display apparatus of claim 13, wherein the first electrode of the capacitor comprise the same material as the light-blocking layer.

16. The organic light-emitting display apparatus of claim 12, wherein the pixel electrode is disposed on the same plane as the light blocking layer.

17. The organic light-emitting display apparatus of claim 12, wherein the first insulating layer has a higher dielectric constant than that of a second insulating layer between the channel region and the gate electrode.

18. The organic light-emitting display apparatus of claim 12, wherein etched surfaces of a second insulating layer between the channel region and the gate electrode and the gate electrode are flush with each other.

19. The organic light-emitting display apparatus of claim 12, further comprising an alignment key on the same plane as the light-blocking layer.

20. The organic light-emitting display apparatus of claim 19, wherein the alignment key comprises the same material as the light-blocking layer.

* * * * *